United States Patent
Lee et al.

(10) Patent No.: US 11,621,031 B2
(45) Date of Patent: Apr. 4, 2023

(54) APPARATUSES AND SYSTEMS FOR PROVIDING POWER TO A MEMORY

(71) Applicant: MICRON TECHNOLOGY, INC., Boise, ID (US)

(72) Inventors: Hyun Yoo Lee, Boise, ID (US); Kang-Yong Kim, Boise, ID (US); Sourabh Dhir, Boise, ID (US); Keun Soo Song, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 81 days.

(21) Appl. No.: 17/302,206

(22) Filed: Apr. 27, 2021

(65) Prior Publication Data

US 2022/0343963 A1    Oct. 27, 2022

(51) Int. Cl.
*G11C 5/14*    (2006.01)
*G11C 11/4074*    (2006.01)

(52) U.S. Cl.
CPC .......... *G11C 11/4074* (2013.01); *G11C 5/147* (2013.01)

(58) Field of Classification Search
CPC ............................. G11C 11/4074; G11C 5/147
See application file for complete search history.

(56) References Cited

U.S. PATENT DOCUMENTS

| 9,059,696 | B1* | 6/2015 | Rahman ......... H03K 19/017581 |
| 9,368,167 | B2* | 6/2016 | Park ..................... G11C 29/022 |
| 9,524,764 | B2* | 12/2016 | Ikegami ............. G11C 11/1673 |
| 9,542,978 | B2* | 1/2017 | Lee ........................ G11C 5/025 |
| 11,004,477 | B2* | 5/2021 | Shibata .................. G11C 5/066 |
| 2015/0277530 | A1 | 10/2015 | Rathnakar et al. |
| 2017/0351315 | A1 | 12/2017 | Ochoa Munoz et al. |
| 2018/0321313 | A1 | 11/2018 | Troy et al. |
| 2019/0237124 | A1 | 8/2019 | Cha |
| 2021/0110850 | A1 | 4/2021 | Rowley |

OTHER PUBLICATIONS

International Search Report & Written Opinion dated Aug. 8, 2022 for PCT Application No. PCT/US2022/026220; pp all.

* cited by examiner

*Primary Examiner* — Khamdan N. Alrobaie
(74) *Attorney, Agent, or Firm* — Dorsey & Whitney LLP

(57) ABSTRACT

In some examples, memory die may include a selection pad, which may be coupled to a power potential. The selection pad may provide a signal to a selection control circuit, which may control a selection circuit to couple a power pad to one of multiple power rails. In some examples, a power management integrated circuit may include a selection circuit to provide one power potential to a package including a memory die when a selection signal has a logic level and another power potential when the selection signal has another logic level.

23 Claims, 6 Drawing Sheets

US 11,621,031 B2

APPARATUSES AND SYSTEMS FOR PROVIDING POWER TO A MEMORY

BACKGROUND

Semiconductor memories are used in many electronic systems to store data that may be retrieved at a later time. Some semiconductor memories are designed to utilize two different voltage levels. In some applications, some components of a memory may utilize a high voltage level while other components may utilize the lower voltage level. In some applications, the memory may utilize a lower voltage when operating at a lower frequency and utilize a higher voltage when operating at a higher frequency. Using the lower voltage when operating at a lower frequency may reduce power consumption of the memory. Demand is growing for more memory components to operate at lower voltages and/or memories to operate at higher frequencies at lower voltages. This may put strain on a memory's power distribution network (PDN).

DETAILED DESCRIPTION

Apparatuses and systems disclosed herein may allow a same memory die to be used with two different packages that provide different power supply potentials to the memory die. Apparatuses, systems, and methods disclosed herein may allow a same memory die and package to be used with different power supply potentials. In some applications, this may improve the performance of a power distribution network (PDN) of the memory. In some applications, this may reduce costs associated with producing different memory die and/or packages for different memory products that have different power specifications.

Figure 1:
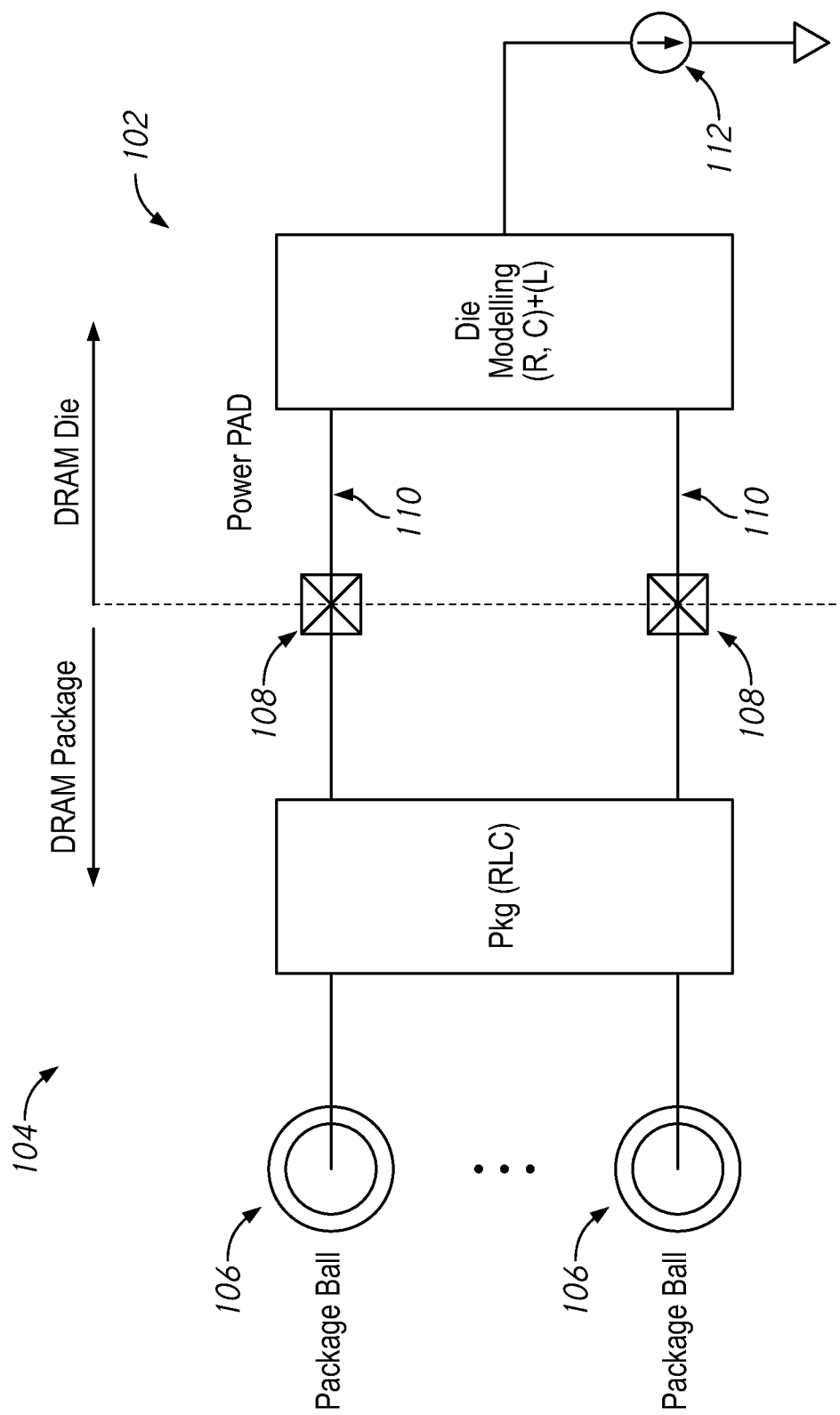
FIG. 1 is a block diagram of a system.

FIG. 1 is a block diagram of a system. The system 100 includes a semiconductor memory die 102 and a package 104. The semiconductor memory die 102 may include a dynamic random access memory (DRAM) device. The package 104 may receive various power supply potentials via one or more package balls 106. The package balls 106 may be coupled via conductive structures (e.g., wires) to power pads 108 (also referred to as power supply terminals) of the memory die 102 to provide one or more of the received power supply potentials (e.g., voltages) for operating the memory die 102. The power pads 108 may be coupled to power rails 110, which are conductive structures that provide the power supply potentials to operate various components within the memory die 102. For example, circuits within the memory die 102 (represented in FIG. 1 as die modeling in memory die 102) may be coupled to the power rails 110 to receive the power supply potentials. Power may be consumed by the circuits, such as, in the form of current draw as shown in FIG. 1 by model current 112. There may be separate power rails 110 for different power supply potentials. For example, one power rail 110 may receive a low potential (e.g., 0.9 V) and another power rail 110 may receive a high potential (e.g., 1.05 V). While potentials for operating the memory die 102 are described herein, one or more of the package balls 106 may provide other inputs to the memory die 102, such as clock signals and/or data signals. Furthermore, although the package 104 and memory die 102 are shown side-by-side, the memory die 102 may be located within the package 104.

In some applications, the number of package balls 106, locations of package balls 106, and/or the inputs provided by the package balls 106 may be defined by a specification or industry standard. In some applications, the operating potentials and/or operating frequencies of the memory die 102 may be defined by a specification or industry standard. For example, the memory die 102 may have to be capable of providing 3200 Mbps at 0.9 V and/or 6400 Mbps at 1.05 V to meet an applicable industry standard.

Industry standards are not static. Standards may be updated or be replaced by new standards. For example, to meet increasing demands for higher speeds at low power, the memory die 102 may have to provide more than 1600 Mbps at 0.9 V to meet a revised standard. This may increase demands on the power rail 110 that provides the 0.9 V potential, which may cause poor performance by the power distribution network (PDN) of the memory die 102.

Figure 2:
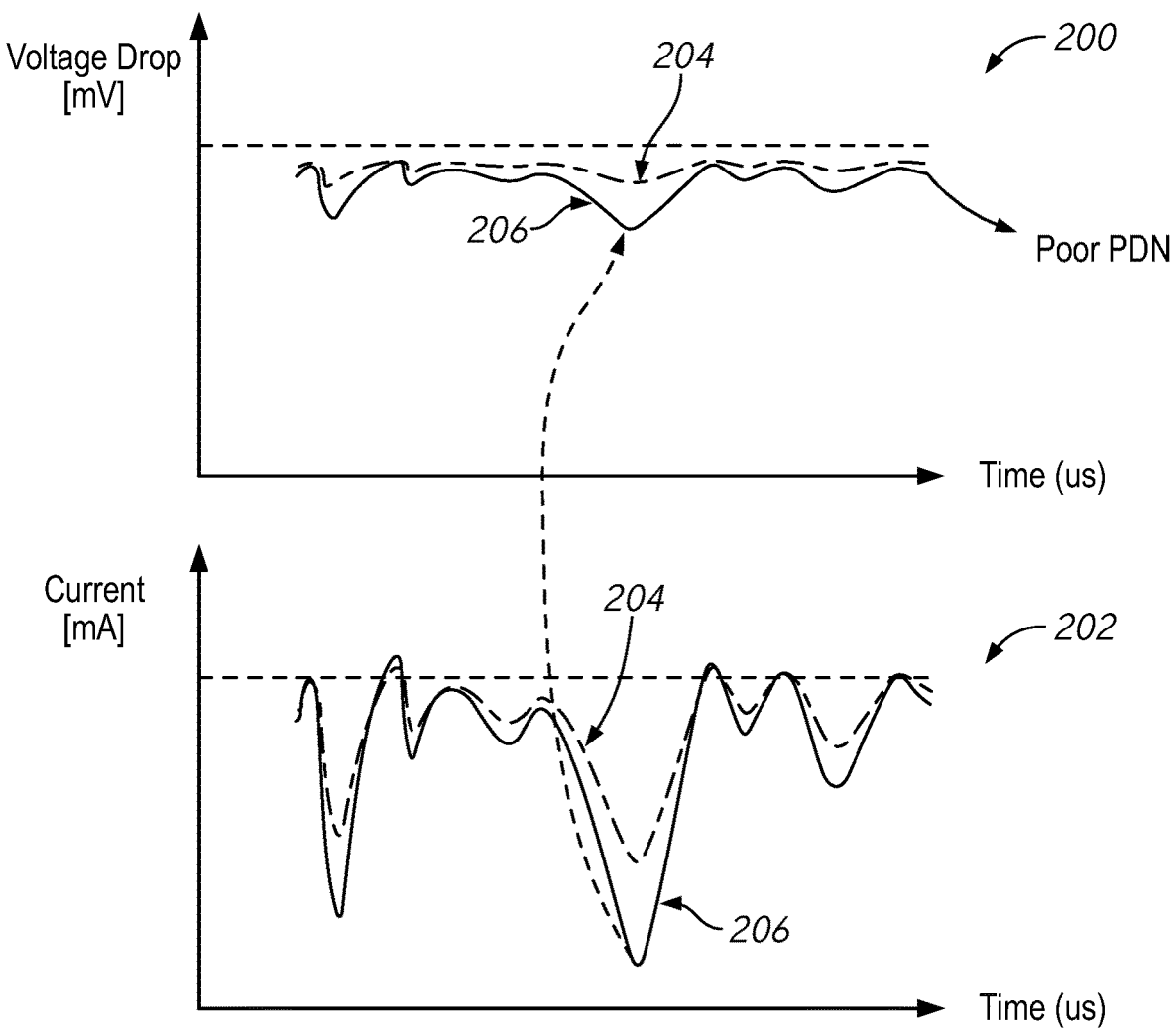
FIG. 2 includes plots illustrating performance of the semiconductor memory die of FIG. 1.

FIG. 2 includes plots illustrating performance of the semiconductor memory die of FIG. 1. Plot 200 is a plot of the voltage of the memory die 102 when modeled as an R,C+L circuit and the package 104 is modeled as an RLC circuit. Plot 202 is a plot of the current of the memory die 102 at the model current 112 shown in FIG. 1. The dashed line 204 in plots 200 and 202 represent "normal" operation of the memory die 102 (e.g., 1600 Mbps at 0.9 V) and the solid line 206 in plots 200 and 202 represent "enhanced" operation of the memory die 102 (e.g., >1600 or >3200 Mbps at 0.9 V). As indicated by the solid line 206, as demand on the power rail 110 providing the desired power supply potential (e.g., 0.9 V) increases, the current and voltage levels drop, which indicate poor PDN performance, which may affect performance of the memory die 102.

Designing a new semiconductor memory die and/or package to meet specifications of a new or revised standard may be expensive. Furthermore, multiple standards or iterations of a standard may coexist in the marketplace. For example, some products may be designed for use with memory devices that meet one industry standard and other products may be designed for use with memory devices that meet another industry standard (or revision thereof). Thus, memory and/or package providers may need to provide memory and packages that meet multiple standards. It may be more cost effective to use a single die and/or single package that meets multiple standards rather than separate die and/or packages for each standard.

Figure 3:
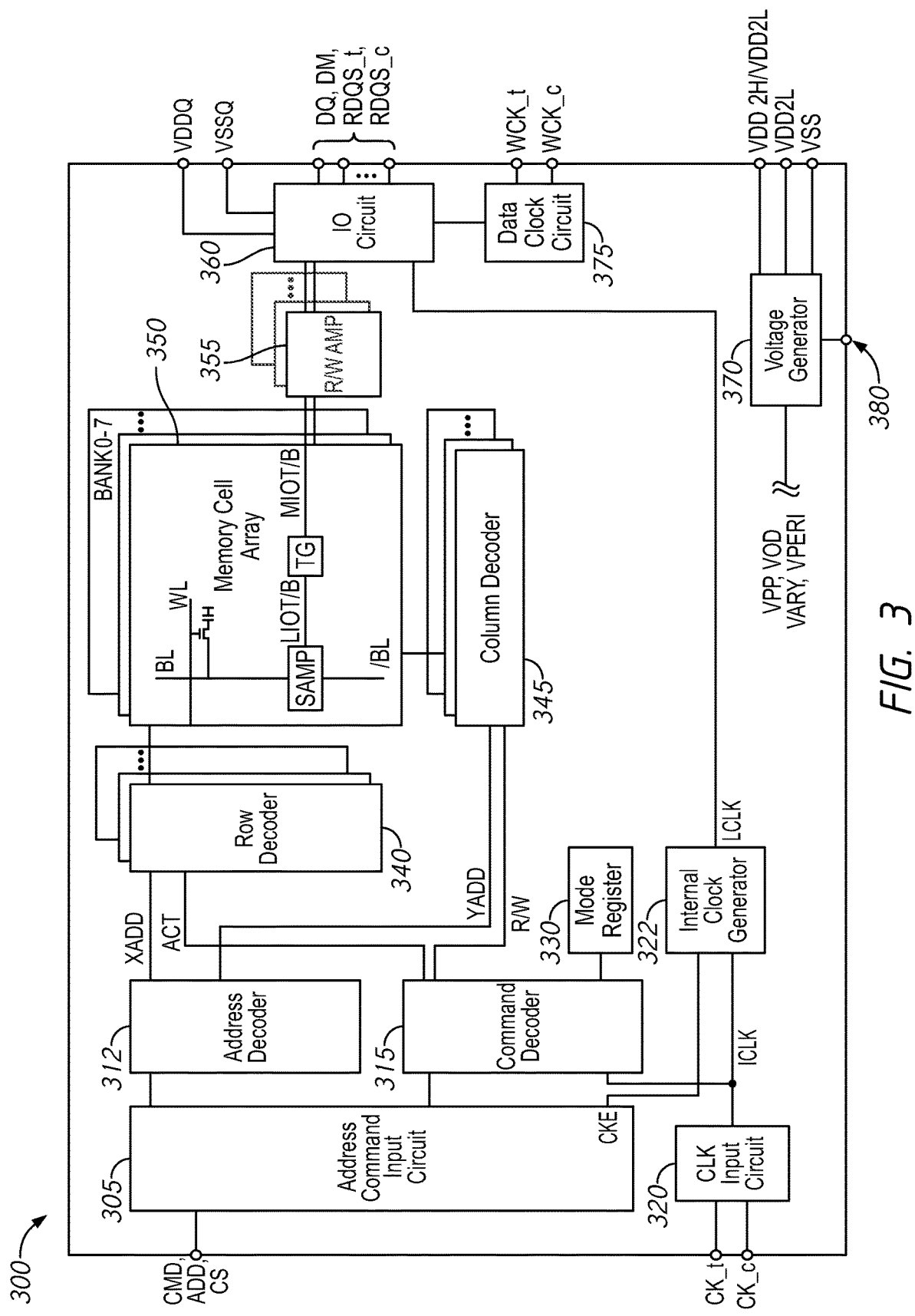
FIG. 3 is a block diagram of an apparatus according to an embodiment of the disclosure.

FIG. 3 is a block diagram of an apparatus according to an embodiment of the disclosure. The apparatus may be a semiconductor device 300, and will be referred to as such. The semiconductor device 300 may include, without limitation, a DRAM device. The semiconductor device 300 may be integrated into a single semiconductor die (e.g., chip) in some embodiments of the disclosure.

The semiconductor device 300 includes a memory array 350. The memory array 350 is shown as including a plurality of memory banks. In the embodiment of FIG. 3, the memory array 350 is shown as including eight memory banks BANK0-BANK7. However, any number of banks may be provided (e.g., 4, 16, 32). Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 340 and selection of the bit lines BL and /BL is performed by a column decoder 345. In the embodiment of FIG. 3, the row decoder 340 includes a respective row decoder for each memory bank and the column decoder 345 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 355 over complementary local data lines (LIOT/B), transfer gate (TG), and complementary main data lines (MIOT/B). Conversely, write data outputted from the read/write amplifiers 355 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 300 may employ a plurality of external terminals that include command and address and chip select (CA/CS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ and DM, and power supply terminals (e.g., pads) to receive power supply potentials VDD2H, VDD2L, VSS, VDDQ, and VSSQ.

The clock terminals are supplied with external clocks CK_t and CK_c that are provided to an input buffer 320. The external clocks may be complementary. The input buffer 320 generates an internal clock ICLK based on the CK_t and CK_c clocks. The ICLK clock is provided to the command decoder 315 and to an internal clock generator 322. The internal clock generator 322 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 375, which generates internal data clocks based on the WCK_t and WCK_c clocks. The internal data clocks are provided to the input/output circuit 360 to time operation of circuits included in the input/output circuit 360 to time the receipt of write data.

The CA/CS terminals may be supplied with memory addresses. The memory addresses supplied to the CA/CS terminals are transferred, via a command/address input circuit 305, to an address decoder 312. The address decoder 312 receives the address and supplies a decoded row address XADD to the row decoder 340 and supplies a decoded column address YADD to the column decoder 345. The CA/CS terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 315 via the command/address input circuit 305. The command decoder 315 includes circuits to decode the internal command signals to generate various internal signals and commands for performing operations. For example, the command decoder 315 may provide a row command signal ACT to select a word line and a column command signal R/W to select a bit line.

When a read command is received, and a row address and a column address are timely supplied with the read command, read data is read from memory cells in the memory array 350 corresponding to the row address and column address. The read command is received by the command decoder 315, which provides internal commands so that read data from the memory array 350 is provided to the read/write amplifiers 355. The read data is output to outside from the data terminals DQ via the input/output circuit 360. The RDQS_t and RDQS_c clocks are provided externally from clock terminals for timing provision of the read data by the input/output circuit 360. The external terminals DQ include several separate terminals, each providing a bit of data synchronized with a clock edge of the RDQS_t and RDQS_c clocks.

When the write command is received, and a row address and a column address are timely supplied with the write command, write data supplied to the data terminals DQ is written to a memory cells in the memory array 350 corresponding to the row address and column address. A data mask may be provided to the data terminals DM to mask portions of the data when written to memory. The write command is received by the command decoder 315, which provides internal commands so that the write data is received by input receivers in the input/output circuit 360. WCK_t and WCK_c clocks are also provided to the external clock terminals for timing the receipt of the write data by the input receivers of the input/output circuit 360. The write data is supplied via the input/output circuit 360 to the read/write amplifiers 355, and by the read/write amplifiers 355 to the memory array 350 to be written into the memory cell MC. As previously described, the external terminals DQ include several separate terminals. With reference to a write operation, each external terminal DQ concurrently receives a bit of data synchronized with a clock edge of the WCK_t and WCK_c clocks.

The power supply terminals may be supplied with one or more power supply potentials (e.g., voltages). In the example shown in FIG. 3, power supply potentials VDD2H, VDD2L, and/or VSS are provided. The power supply potentials VDD2H, VDD2L, and VSS are supplied to an internal voltage generator circuit 370, which may include one or more power rails (not shown in FIG. 3). In some embodiments, the power supply potentials may be provided on individual power rails (e.g., a separate power rails for the power input terminals). The internal voltage generator circuit 370 generates various internal potentials VPP, VOD, VARY, VPERI, and the like based on the power supply potentials VDD2H, VDD2L, and/or VSS supplied to the power supply terminals. The internal potential VPP is mainly used in the row decoder 340, the internal potentials VOD and VARY are mainly used in the sense amplifiers SAMP included in the memory array 350, and the internal potential VPERI is used in many peripheral circuit blocks. Different external potentials may be provided to the device 300 and/or different internal potentials may be generated by the internal voltage generator circuit 370 in other examples.

In some embodiments, the power supply terminals are also supplied with power supply potentials VDDQ and VSSQ. However, in some embodiments, only VDDQ may be provided. The power supply potentials VDDQ and VSSQ are supplied to the input/output circuit 360. The power supply potentials VDDQ and VSSQ supplied to the power supply terminals may be the same potentials as the power supply potentials VDD2H or VDD2L and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 360 so that power supply noise generated by the input/output circuit 360 does not propagate to the other circuit blocks.

According to embodiments of the present disclosure, the device 300 may receive a same power supply potential at multiple power supply terminals. In the example shown in FIG. 3, VDD2H may be provided at a terminal (e.g., pad) and VDD2L at another pad, or the device 300 may receive VDD2L at both terminals. In some embodiments, the device 300 may include a selection pad 380 (e.g., selection input terminal). The selection pad 380 may be coupled to a power supply potential (e.g., VSS, VDD2L) to provide a potential to the voltage generator 370 that is indicative of what power supply potentials are provided at the power supply terminals. Responsive to the signal provided by the selection pad 380, the voltage generator 370 may couple both power supply terminals to a same power rail or different power rails. For example, when the selection pad 380 indicates that VDD2H and VDD2L are provided at the power supply terminals, the power supply terminals may be coupled to different power rails. When the selection pad 380 indicates that VDD2L is provided at multiple power supply terminals, the voltage generator 370 may couple the power supply terminals to a same terminal. In other embodiments, a selection circuit and/or at least a portion of the power rails may be located outside the voltage generator 370.

By providing a power supply potential to multiple power supply terminals and coupling the power supply terminals to a same power rail more power may be provided to the power rail. In some applications, this may reduce drops in performance in the PDN when demand on the power rail is high. This may allow the device 300 to operate at higher frequencies, even at lower power in some applications. Furthermore, by providing a selection pad 380 and a selection circuit for coupling the power supply terminals to power rails, a same memory die may be used for multiple product types.

Figure 4:
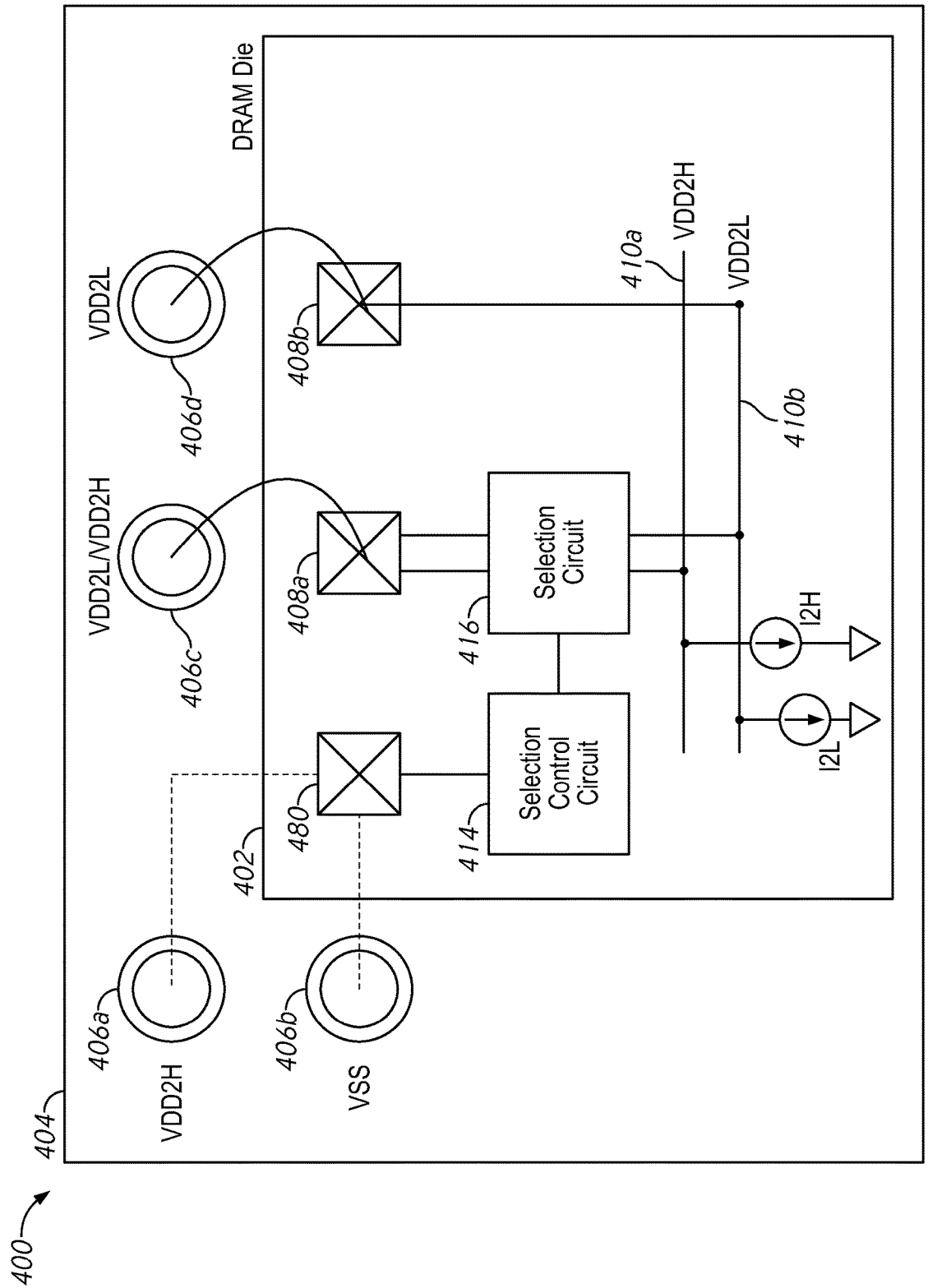
FIG. 4 is a block diagram of a system including a memory die and a package according to at least one embodiment of the present disclosure.

FIG. 4 is a block diagram of a system including a memory die and a package according to at least one embodiment of the present disclosure. In some embodiments, the semiconductor memory die 402 and package 404 may be an apparatus included in the system 400. In some embodiments, the memory die 402 may be at least partially enclosed by package 404. In some embodiments, package 404 may be formed to accept at least a portion of memory die 402. In some embodiments, the system 400 may include additional components (not shown), such as a memory controller, a power management integrated circuit, and/or a processor. In some embodiments, the memory die 402 may include memory device 300. However, not all components of a memory device included on memory die 402 are shown. Similarly, not all components of the package 404 are shown in FIG. 4.

Package 404 may include package balls 406, which may provide various inputs, such as power supply potentials. In the example shown in FIG. 4, package ball 406a provides VDD2H, package ball 406b provides VSS, package ball 406c provides either VDD2L or VDD2H, and package ball 406d provides VDD2L. In some examples, VDD2H may be a high potential (e.g., 1.05 V), VDD2L may be a lower potential (e.g., 0.9 V), and VSS may be a reference potential (e.g., ground). Some or all of the package balls 406 may be coupled to power pads (e.g., power input terminals) 408 of the memory die 402 to provide the power potentials. In the example shown in FIG. 4, power pad 408a is coupled to package ball 406c and power pad 408b is coupled to package ball 406d.

The memory die 402 may include power rails 410 for providing the power potentials received at the power pads 408 to various components of the memory die 402, such as read/write amps 355, column decoder 345, and row decoder 340 shown in FIG. 3. In some embodiments, different power rails 410 may be provided for different power potentials. In the example shown in FIG. 4, power rail 410a provides power potential VDD2H and power rail 410b provides power potential VDD2L.

In some embodiments, one or more of the power pads 408 may be selectively coupled to different power rails 410. In the example shown in FIG. 4, power pad 408a may be selectively coupled to power rail 410a or power rail 410b by selection circuit 416. The power rail 410 coupled to power pad 408a may be based, at least in part, on the power potential provided to power pads 408a and 408b. In the example shown in FIG. 4, power pad 408b may receive VDD2L and may be coupled to power rail 410b. When power pad 408a also receives VDD2L, the selection circuit 416 may couple power pad 408a to power rail 410b as well. When power pad 408 receives VDD2H, the selection circuit 416 may couple power pad 408a to power rail 410a. Thus, in some embodiments, when power pads 408 receive a same power supply potential, the power pads 408 may be coupled to a same power rail 410 and when power pads 408 receive different power supply potentials, the power pads 408 may be coupled to different power rails 410.

In some embodiments, the selection circuit 416 may couple the power pad 408a to power rail 410a or 410b based, at least in part, on a signal received from a selection control circuit 414. In some embodiments, a state (e.g., a logic state, a voltage) of the signal provided by the selection control circuit 414 may be based, at least in part, on a power potential received by a selection pad 480 coupled to the selection control circuit 414. In some embodiments, selection pad 480 may implement selection pad 380. In some embodiments, when package ball 406b (e.g., VSS) is coupled to selection pad 480, the selection control circuit 414 may provide a signal that causes the selection circuit 416 to couple power pad 408a to power rail 410a. When package ball 406a (e.g., VDD2H) is coupled to selection pad 480, the selection control circuit 414 may provide a signal that causes the selection circuit 416 to couple power pad 408a to power rail 410b.

In some embodiments, the signal provided by selection control circuit 414 may include multiple signals and/or multiple parts, and different signals or parts of the signal may be provided to different portions of the selection circuit 416. For example, selection circuit 416 may include multiple switches (not shown) in some embodiments and each switch may receive a signal from the selection control circuit 414 to open or close the switch. In some embodiments, the selection control circuit 414 and/or selection circuit 416 may be included in voltage generator, such as voltage generator 370. However, in other embodiments, the selection control circuit 414 and/or selection circuit 416 may be located elsewhere on the memory die 402.

When power pads 408a and 408b are coupled to power rail 410b when the power pads 408a and 408b provide a same power supply potential, it may allow more power to be provided to the power rail 410b. For example, coupling multiple power pads 408 providing a same power supply potential may allow more current to be drawn on the power rail 410b. The increase in power availability may reduce voltage and/or current drops on the power rail 410b, even when demands on the power rail 410b increase. This may improve performance of the PDN. This may reduce impacts on performance of the memory die 402. In some applications, this may permit the memory die 402 to operate at a higher frequency (e.g., read and write data at a faster rate) at lower power supply potentials.

The selection pad 480, selection control circuit 414, and/or selection circuit 416 may allow a same memory die 402 to be used with multiple types of packages 404. For example, one package 404 may provide one power potential (e.g., VDD2H) at package ball 406c and another package 404 may provide another power potential (e.g., VDD2L) at package ball 406c. Which package 404 receives memory die 402 may be indicated by which package ball 406a or 406b is coupled to selection pad 480.

By selectively coupling one or more power pads 408 to different power rails 410, a same memory die 402 may be used with products having different power specifications, which may or may not be defined by an industry standard. For example, memory die 402 may be used with products that utilize both VDD2H and VDD2L (e.g., when power pad 408a is coupled to power rail 410a and power pad 408b is coupled to power rail 410b) and products that utilize only VDD2L or put greater demands on VDD2L (e.g., when power pads 408a and 408b are coupled to power rail 410b). This may reduce design, fabrication, and/or assembly time and/or costs compared to when different memory die 402 are used for products with different power specifications.

Figure 5:
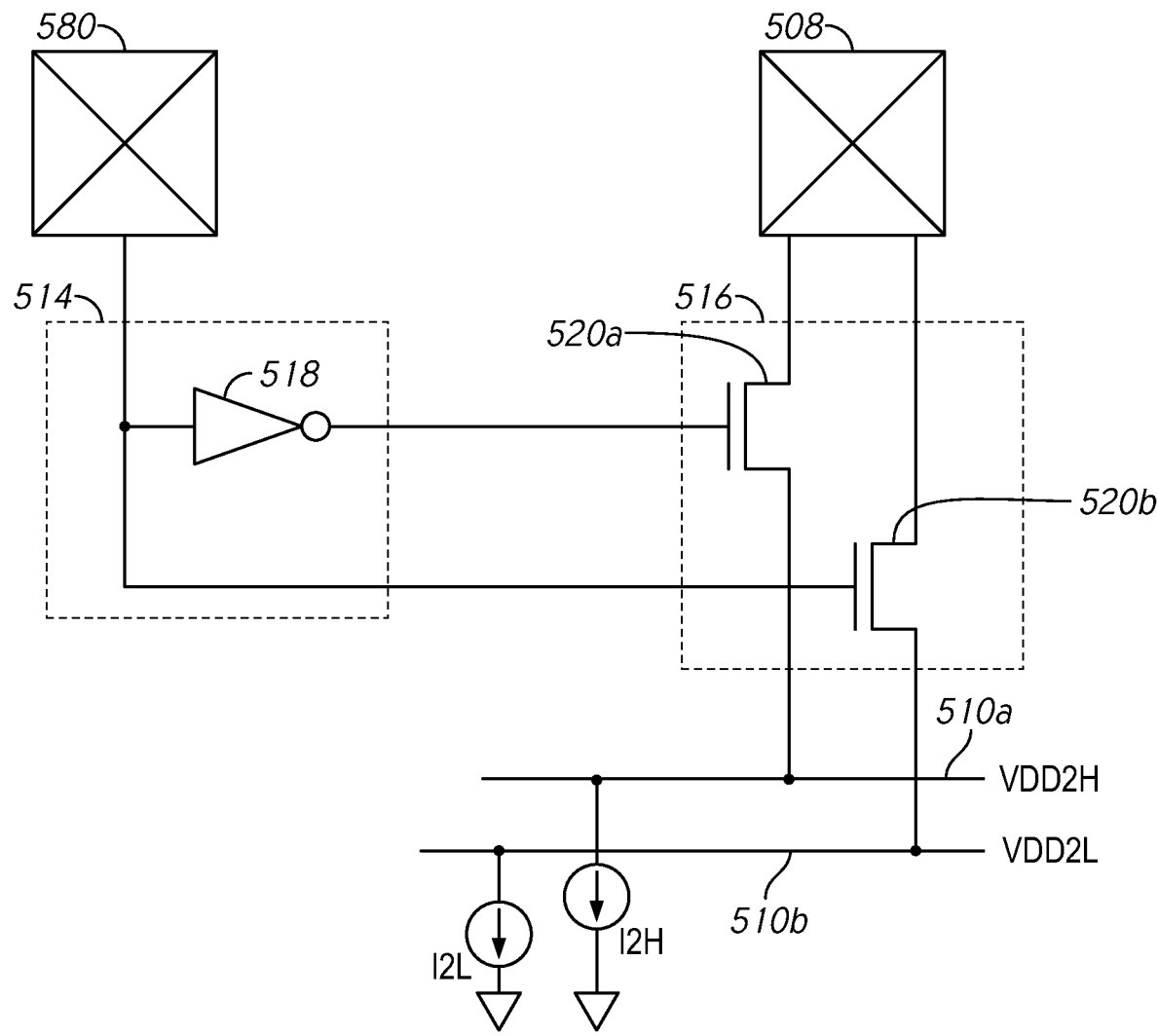
FIG. 5 is a circuit diagram of an example selection control circuit and an example selection circuit according to at least one embodiment of the present disclosure.

FIG. 5 is a circuit diagram of an example selection control circuit and an example selection circuit according to at least one embodiment of the present disclosure. In addition to selection control circuit 514 and selection circuit 516, for context, selection pad 580, power pad 508, and power rails 510a and 510b are also shown. In some embodiments, the selection control circuit 514 may be used to implement selection control circuit 414 and the selection circuit 516 may be used to implement selection circuit 416. In some embodiments, the selection pad 580 may be used to implement selection pad 380 and/or 480, the power pad 508 may be used to implement power pad 408a, and/or power rails 510a and 510b may be used to implement power rails 410a and 410b. The circuitry shown in FIG. 5 is merely exemplary and other circuit components and/or arrangements may be used in other embodiments.

In the example shown in FIG. 5, power pad 508 may be coupled to one of two or more power potentials such as VDD2H or VDD2L as shown in FIG. 4. In some embodiments, VDD2H may have a higher potential than VDD2L. A power potential may be provided to selection pad 580 to determine to which power rail 510 power pad 508 is coupled. The power potential provided to selection pad 580 may be based, at least in part, on the power potential provided to the power pad 508. For example, when power pad 508 is coupled to VDD2H, selection pad 580 may be coupled to a reference potential, such as VSS. The reference potential VSS may be lower than power potential VDD2H in some embodiments. In some embodiments, the reference potential VSS may be lower than power potential VDD2L. When power pad 508 is coupled to VDD2L, selection pad 580 may be coupled to VDD2H. The power potential provided to selection pad 580 and/or a signal based on the power potential, may be provided to the selection control circuit 514 by a conductive structure in some embodiments.

In some embodiments, the selection control circuit 514 may include control logic to provide one or more signals to selection circuit 516 based on the power potential and/or signal received from the selection pad 580. In the example shown in FIG. 5, selection control circuit 514 includes an inverter 518.

The selection circuit 516 may include switches 520 to selectively couple power pad 508 to power rails 510. In the example shown, selection circuit 516 includes two switches 520a and 520b to selectively couple power pad 508 to power rail 510a or 510b, respectively. In other embodiments, selection circuit 516 may include more than two switches 520, for example, when there are more than two power rails 510. In the example shown in FIG. 5, the switches 520 include N-MOS (metal oxide semiconductor) transistors. However, other switches may be used in other embodiments.

When selection pad 580 is coupled to the reference power potential VSS, the signal and/or potential provided by selection pad 580 may be equivalent to a low logic state and/or low potential (e.g., low signal). The selection control circuit 514 provides an inverted signal from the inverter 518 to switch 520a. The inverted signal may be equivalent to a high logic state and/or high potential (e.g., high signal). The inverted signal may activate the switch 520a of the selection circuit 516 and couple the power pad 508 to power rail 510a. The selection control circuit 514 may provide a non-inverted (e.g., original) signal to switch 520b. The low signal may deactivate switch 520b, decoupling power pad 508 from power rail 510b. In the example shown in FIG. 5, the power pad 508 may provide power supply potential VDD2H to power rail 510a.

When selection pad 580 is coupled to the power potential VDD2H, the signal and/or potential provided by selection pad 580 may be equivalent to a high logic state and/or high potential. The selection control circuit 514 provides an inverted signal from the inverter 518 to switch 520a. The inverted signal may be equivalent to a low logic state and/or low potential. The inverted signal may deactivate the switch 520a of the selection circuit 516 and decouple the power pad 508 from power rail 510a. The selection control circuit 514 may provide the signal to switch 520b. The high signal may activate switch 520b, coupling power pad 508 to power rail 510a. In the example shown in FIG. 5, the power pad 508 may provide power supply potential VDD2L to power rail 510b.

While the embodiments shown in FIGS. 3-5 may allow a single memory die design to be used for products with different power specifications, in some cases, these embodiments may require use of two different packages designed to accept the memory die and meet the different power potential specifications. In some applications, it may be desirable to provide a same memory die and a same package to meet different power specifications. In some embodiments, a component, such as a power management component, external to the memory die and package may be used to select the power supply potentials provided to the package and/or memory die. In some applications, using the external component to select the provided power supply potentials may allow a single package and die design to be used with products having different power specifications.

Figure 6:
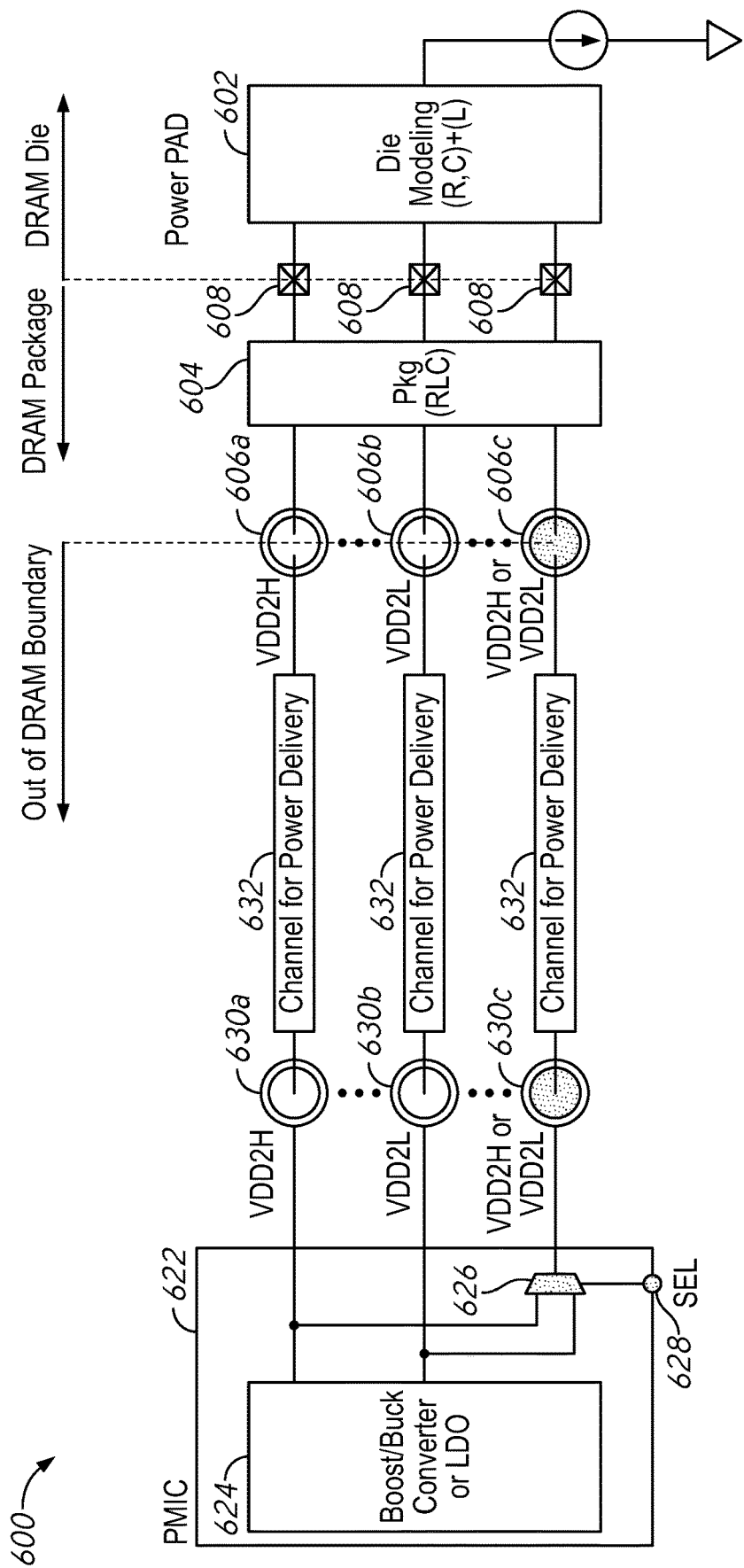
FIG. 6 is a block diagram of a system according to at least one embodiment of the present disclosure.

FIG. 6 is a block diagram of a system according to at least one embodiment of the present disclosure. The system 600 may include a semiconductor memory die 602, a package 604, and a power management integrated circuit (PMIC) 622. In some embodiments, the system 600 may include additional components (not shown), such as a memory controller and/or a processor. Although shown side-by-side, memory die 602 may be at least partially enclosed within package 604 in some embodiments. In some embodiments, package 604 may be formed to accept at least a portion of memory die 602.

Similar to memory die 102 and package 104, package 604 may provide one or more power supply potentials to power pads 608 memory die 602. In some embodiments, the power pads 608 may provide power to corresponding power rails (not shown) of the memory die 602. In some embodiments, the power potentials may be provided to the package 604 by the PMIC 622. The PMIC 622 may include a power supply potential generator 624 to provide the power supply potentials. The power supply potential generator 624 may include a boost/buck converter and/or a low-dropout regulator (LDO) in some embodiments. The power supply potential generator 624 may provide multiple different power potentials in some embodiments. In the example shown in FIG. 6, the power supply potential generator 624 provides power potentials VDD2H and VDD2L. The power potentials may be provided to one or more package balls 630 of the PMIC 622. The package balls 630 may be coupled to corresponding ones of the package balls 606 of the package 604 by channels 632. In some embodiments, the channels 632 may include conductive structures (e.g., wires) that may provide the power supply potentials from the power supply potential generator 624 to the package 604.

In some embodiments, the PMIC 622 may include a selection control circuit 626 to couple one of the multiple different power supply potentials to one or more package balls 630. The package balls 630 may be included with the PMIC 622 and/or another component that includes the PMIC 622. In the example shown in FIG. 6, selection control circuit 626 may provide either VDD2H or VDD2L to package ball 630c. The PMIC 622 may include a selection pad 628. The selection pad 628 may receive a power supply potential and/or signal SEL to control which power supply potential is provided by the selection control circuit 626. In the example shown in FIG. 6, the selection control circuit 626 includes a multiplexer which receives the different power supply potentials and provides one power supply potential when SEL is in one state and another power supply potential when SEL is in another state. For example, the selection control circuit 626 may provide VDD2H when SEL is in one state and provide VDD2L when SEL is in another state. Thus, the package ball 606c of the package 604 may receive either VDD2H or VDD2L and provide the received power supply potential to the memory die 602 via the power pad 608.

In the embodiment shown in FIG. 6, the selection control circuit 626 and selection pad 628 may determine what power supply potential is provided to the package 604 and/or memory die 602. The selection may be based, at least in part, on the power potential specifications of a product including system 600. For example, a higher power product may provide SEL with a state such that VDD2H is provided to package ball 630c. In contrast, a lower power product may provide SEL with a state such that VDD2L is provided to package ball 630c. Using PMIC 622 to select the power potential provided to the package 604 and/or memory die 602 may allow a same design of the package 604 and the memory die 602 to be used with products having different power specifications (e.g., higher and lower power products). In some applications, this may reduce design and/or manufacturing costs of the memory die 602 and/or package 604.

Apparatuses and systems disclosed herein may allow a same memory die to be used with two different packages that provide different power supply potentials to the memory die. Apparatuses, systems, and methods disclosed herein may allow a same memory die and package to be used with different power supply potentials. In some applications, this may improve the performance of a power distribution network (PDN) of the memory. In some applications, this may reduce costs associated with producing different memory die and/or packages for different memory products that have different power specifications.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus, comprising:
   a power pad;
   a first power rail;
   a second power rail;
   a selection pad configured to provide a first signal, wherein a state of the first signal is based, at least in part, on a voltage level provided to the selection pad;
   a selection control circuit coupled to the selection pad and configured to provide a second signal, wherein a state of the second signal is based, at least in part, on the state of the first signal; and
   a selection circuit configured to receive the second signal, wherein the selection circuit is further configured to couple the power pad to the first power rail when the second signal has a first state and couple the power pad to the second power rail when the second signal has a second state.

2. The apparatus of claim 1, further comprising a second power pad coupled to the first power rail or the second power rail.

3. The apparatus of claim 2, wherein the power pad and the second power pad are configured to provide a same potential when both are coupled to the first power rail or the second power rail, and wherein the power pad and the second power pad are configured to provide different potentials when coupled to different ones of the first power rail and the second power rail.

4. The apparatus of claim 3, wherein the same potential is a lower potential than a potential provided by the power pad when the power pad and the second power pad are coupled to different ones of the first power rail and the second power rail.

5. The apparatus of claim 1, wherein the selection circuit comprises a first switch coupled between the power pad and the first power rail and a second switch coupled between the power pad and the second power rail.

6. The apparatus of claim 5, wherein the second signal comprises a first part and a second part, wherein the first part is provided to the first switch and the second part is provided to the second switch.

7. The apparatus of claim 1, further comprising a memory die, wherein the memory die comprises the power pad, the first power rail, the second power rail, the selection pad, the selection control circuit, and the selection circuit.

8. The apparatus of claim 7, further comprising a package configured to enclose at least a portion of the memory die, wherein the package comprises:
a first ball configured to provide a first potential to the power pad when coupled to the power pad;
a second ball configured to provide a second potential or a third potential to the selection pad when coupled to the selection pad; and
wherein the first signal has a first state when the first potential is provided and the first signal has a second state when the third potential is provided.

9. The apparatus of claim 1, wherein the power pad provides a first potential when coupled to the first power rail and a second potential when coupled to the second power rail, wherein the first potential and the second potential are different.

10. An apparatus comprising:
a memory die comprising:
a power pad;
a first power rail;
a second power rail;
a selection pad; and
a package configured to enclose at least a portion of the memory die, wherein the package comprises:
a first ball configured to provide a first potential; and
a second ball configured to provide a second potential,
wherein the memory die is configured to couple the power pad to the first power rail when the first ball is coupled to the selection pad and couple the power pad to the second power rail when the second ball is coupled to the selection pad.

11. The apparatus of claim 10, wherein the package further comprises a third ball coupled to the power pad and is configured to provide a third potential.

12. The apparatus of claim 11, wherein the memory die further comprises a second power pad coupled to the second power rail and the package further comprises a fourth ball coupled to the second power pad and is configured to provide a fourth potential to the second power pad.

13. The apparatus of claim 12, wherein the third potential and the fourth potential are a same potential when the second ball is coupled to the selection pad.

14. The apparatus of claim 12, wherein the fourth potential is lower than the second potential.

15. The apparatus of claim 10, wherein the first potential is a reference potential and the second potential is greater than the reference potential.

16. The apparatus of claim 10, wherein the memory die further comprises:
a selection control circuit configured to receive a first signal from the selection pad and provide a second signal based, at least in part, on a state of the first signal; and
a selection circuit configured to couple the power pad to the first power rail or the second power rail based, at least in part, on a state of the second signal.

17. The apparatus of claim 16, wherein the selection control circuit comprises an inverter.

18. A system comprising:
a power management integrated circuit (PMIC) configured to provide a plurality of potentials to a first plurality of balls, wherein the PMIC comprises:
a selection circuit configured to select a potential of the plurality of potentials to provide to a ball of the first plurality of balls; and
a selection pad configured to receive a selection signal, wherein the selection circuit selects the potential of the plurality of potentials based, at least in part, a state of the selection signal, wherein the selection circuit provides a first potential of the plurality of potentials when the selection signal is in a first state and a second potential of the plurality of potentials when the selection signal is in a second state, wherein the first and second potentials are different.

19. The system of claim 18, further comprising:
a package comprising a second plurality of balls coupled to corresponding ones of the first plurality of balls; and
a memory die comprising a plurality of power pads coupled to corresponding ones of the second plurality of balls.

20. The system of claim 19, wherein the memory die is at least partially enclosed by the package.

21. The system of claim 18, therein the selection circuit comprises a multiplexer.

22. The system of claim 18, wherein the PMIC comprises a power potential generator configured to generate the plurality of potentials.

23. The system of claim 22, wherein the power potential generator comprises at least one of a boost/buck converter or a low-dropout regulator.

* * * * *